(12) United States Patent
Wu et al.

(10) Patent No.: US 12,205,635 B2
(45) Date of Patent: Jan. 21, 2025

(54) MEMORY MODULE WITH IMPROVED TIMING ADAPTIVITY OF SENSING AMPLIFICATION

(71) Applicant: M31 TECHNOLOGY CORPORATION, Hsinchu County (TW)

(72) Inventors: Po-Yu Wu, Hsinchu County (TW); Hao-I Yang, Hsinchu County (TW); Nan-Chun Lien, Hsinchu County (TW)

(73) Assignee: M31 TECHNOLOGY CORPORATION, Hsinchu County (TW)

( * ) Notice: Subject to any disclaimer, the term of this patent is extended or adjusted under 35 U.S.C. 154(b) by 153 days.

(21) Appl. No.: 18/129,196

(22) Filed: Mar. 31, 2023

(65) Prior Publication Data

US 2023/0335188 A1    Oct. 19, 2023

(30) Foreign Application Priority Data

Apr. 13, 2022    (TW) .................................. 111114013

(51) Int. Cl.
*G11C 11/412*    (2006.01)
*G11C 11/419*    (2006.01)
*H03K 19/20*    (2006.01)

(52) U.S. Cl.
CPC .......... *G11C 11/419* (2013.01); *G11C 11/412* (2013.01); *H03K 19/20* (2013.01)

(58) Field of Classification Search
CPC ... G11C 11/419; G11C 11/412; G11C 11/418; G11C 7/227; H03K 19/20

USPC ......................................................... 365/205
See application file for complete search history.

(56) References Cited

U.S. PATENT DOCUMENTS

| | | | | |
|---|---|---|---|---|
| 5,724,294 A | * | 3/1998 | Khieu | G11C 7/14 365/207 |
| 2014/0071775 A1 | * | 3/2014 | Evans | G11C 7/222 365/194 |
| 2016/0086657 A1 | * | 3/2016 | Hong | G11C 11/417 365/154 |
| 2019/0096477 A1 | * | 3/2019 | Clinton | G11C 7/227 |
| 2019/0392876 A1 | * | 12/2019 | Katoch | G11C 7/22 |
| 2022/0262446 A1 | * | 8/2022 | Chang | G11C 17/18 |

* cited by examiner

*Primary Examiner* — Ly D Pham
(74) *Attorney, Agent, or Firm* — WPAT, PC

(57) ABSTRACT

A memory module with improved timing adaptivity of sensing amplification, comprises at least one sensing amplifier, a tracking word line, a tracking bit line and a pulse-width controller. The tracking word line comprises a front node and an end node. Each said sensing amplifier is enabled/disabled when an enabling signal is activated/deactivated. The pulse-width controller is coupled to the tracking bit line, the front node and the end node. When a voltage of the tracking bit line changes to a predetermined voltage, the pulse-width controller activates the enabling signal, and causes a voltage of the front node to change. When the voltage of the front node changes, the tracking word line causes a voltage of the end node to change after a first delay time. When the voltage of the end node changes, the pulse-width controller deactivates the enabling signal after a second delay time.

20 Claims, 6 Drawing Sheets

MEMORY MODULE WITH IMPROVED TIMING ADAPTIVITY OF SENSING AMPLIFICATION

This application claims the benefit of Taiwan application Serial No. 111114013, filed Apr. 13, 2022, the subject matter of which is incorporated herein by reference.

FIELD OF THE INVENTION

The present invention relates to a memory module with improved timing adaptivity of sensing amplification, and more particularly, to a memory module allowing a duration of enabling sensing amplifiers to adapt number of inputs/outputs and/or supply voltage(s) of sensing amplifiers.

BACKGROUND OF THE INVENTION

Memory module, such as embedded static random access memory module, is essential building block of integrated circuit (semiconductor chip).

A memory module includes a plurality of memory cells and a plurality of sensing amplifiers; the sensing amplifiers are controlled by an enabling signal. When the enabling signal is activated, the sensing amplifiers are enabled to operate; when the enabling signal is deactivated, the sensing amplifiers are disabled to stop operating.

When the memory module reads data stored in a memory cell during a read cycle, a bit line associated with the memory cell is electrically connected to an associated sensing amplifier, then the enabling signal is activated, so the sensing amplifier is enabled to sense a voltage of the associated bit line, and to accordingly determine the data stored in the memory cell; afterward, the enabling signal is deactivated, the sensing amplifier is therefore disabled to stop sensing, and the read cycle ends. During each read cycle, a duration for the sensing amplifier to be enabled to operate depends on a duration during which the enabling signal is activated; i.e., depends on a pulse-width of the enabling signal. If the pulse-width of the enabling signal is insufficient, the duration for the sensing amplifier to operate will be insufficient, and correctness of data reading will be adversely impacted.

In a prior art, a conventional memory module includes a fixed number of serially connected inverters, and the pulse-width of the enabling signal depends on a sum of gate delays of these serially connected inverters. Therefore, in the prior art, the pulse-width of the enabling signal lacks flexibility, and fails to adapt different demands of various memory modules. Besides, the serially connected inverters occupy considerable layout area.

SUMMARY OF THE INVENTION

An object of the invention is providing a memory module (e.g., 100 in FIG. 1) with improved timing adaptivity of sensing amplification. The memory module may comprise at least one bit line (e.g., BL[q]), at least one word line (e.g., WL[p]), a tracking bit line (e.g., TBL), a tracking word line (e.g., TWL), at least one memory cell (e.g., c[p,q]), at least one tracking cell (e.g., tc[p]), at least one sensing amplifier (e.g., SA[k]), and a pulse-width controller (e.g., 300 in FIG. 4). The tracking word line may comprise a front node (e.g., w1) and an end node (e.g., w3), and a length between the front node and the end node may be positively correlated to a length of each said word line. Each said memory cell may be coupled to one of the at least one bit line and one of the at least one word line. Each said tracking cell may be coupled to the tracking bit line. Each said sensing amplifier may be coupled to one of the at least one bit line, may receive an enabling signal (e.g., GS), may be enabled when the enabling signal is activated, and may be disabled when the enabling signal is deactivated. The pulse-width controller may be coupled to the tracking bit line, the front node, and the end node, and may provide the enabling signal. When a voltage (e.g., vTBL in FIG. 5) of the tracking bit line changes to a predetermined voltage (e.g., vt0, at a time point t3, FIG. 5), the pulse-width controller may activate the enabling signal, and may cause a voltage (e.g., vw1 in FIG. 5) of the front node to change (e.g., to start changing from a voltage v4 to a voltage v3 at a time point t7, FIG. 5). When the voltage of the front node changes, the tracking word line may cause a voltage (e.g., vw3, FIG. 5) of the end node to change (e.g., to start changing from the voltage v4 to the voltage v3 at a time point t8, FIG. 5) after a first delay time (e.g., d1 in FIG. 5). When the voltage of the end node changes, the pulse-width controller may deactivate the enabling signal (e.g., at a time point t12, FIG. 5) after a second delay time (e.g., d2 in FIG. 5).

In an embodiment (e.g., FIG. 6), the pulse-width controller may have a portion (e.g., a logic gate G1) which may be supplied by a first supply voltage (e.g., Vdd1 in FIG. 6), and each said sensing amplifier (e.g., SA[k] in FIG. 6) may at least have a portion (e.g., s2[k] in FIG. 6) which may be supplied by a second supply voltage (e.g., Vdd2 in FIG. 6). In an embodiment, the first supply voltage and the second supply voltage may be different, and a duration of the second delay time may be negatively correlated to a value of the second supply voltage.

In an embodiment (e.g., FIG. 6), the pulse-width controller may have two portions (e.g., the logic gate G1 and a delay circuit 500 in FIG. 6) respectively supplied by two different supply voltages (e.g., Vdd1 and Vdd2 in FIG. 6), and a duration of the second delay time is negatively correlated to one (e.g., Vdd2 in FIG. 6) of the two different supply voltages.

In an embodiment (e.g., FIG. 4), the pulse-width controller may comprise a first logic gate (e.g., G1 in FIG. 4). The first logic gate may comprise a first input terminal (e.g., i1), a second input terminal (e.g., i2), and a first output terminal (e.g., o1) respectively coupled to the tracking bit line, the end node, and a first node (e.g., n1). The pulse-width controller may form the enabling signal at a third node (e.g., n3), and the third node may be coupled to the at least one sensing amplifier. A voltage of the third node may be controlled by a voltage of the first node when the memory module conducts data read. When the pulse-width controller activates the enabling signal, the pulse-width controller may cause the enabling signal to change from a first level (e.g., v1 in FIG. 5) to a second level (e.g., v2 in FIG. 5); when the pulse-width controller deactivates the enabling signal, the pulse-width controller may cause the enabling signal to change back from the second level to the first level. In an embodiment (e.g., FIG. 4), the pulse-width controller may further comprise a first inverter (e.g., iv1 in FIG. 4) coupled between the tracking bit line and the first input terminal. In an embodiment (e.g., FIG. 4), the first logic gate may be a NAND gate.

In an embodiment (e.g., FIG. 4), the pulse-width controller may further comprise a third logic gate (e.g., G3 in FIG. 4) and a delay circuit (e.g., 500 in FIG. 4). The third logic gate may comprise a fifth input terminal (e.g., i5), a sixth input terminal (e.g., i6) and a third output terminal (e.g., o3). The fifth input terminal may be coupled to a second node (e.g., n2), the delay circuit may be coupled between the second node and the sixth input terminal, and the third output terminal may be coupled to the third node. A voltage of the second node may be controlled by the voltage of the first node when the memory module conducts data read. In an embodiment (e.g., FIG. 4), the pulse-width controller may further comprise a third inverter (e.g., iv3 in FIG. 4) coupled between the third output terminal and the third node.

In an embodiment (e.g., FIG. 6), the first logic gate and the delay circuit may be respectively supplied by a first supply voltage (e.g., Vdd1 in FIG. 6) and a second supply voltage (e.g., Vdd2 in FIG. 6), and the first supply voltage may be different from the second supply voltage. In an embodiment (e.g., FIG. 6), each said sensing amplifier may at least have a portion (e.g., s2[k] in FIG. 6) supplied by the second supply voltage.

In an embodiment (e.g., FIG. 4), the pulse-width controller may further comprise a second logic gate (e.g., G2 in FIG. 4). The second logic gate may comprise a third input terminal (e.g., i3), a fourth input terminal (e.g., i4) and a second output terminal (e.g., o2) respectively coupled to the first node, a fourth node (e.g., n4) and the second node.

In an embodiment (e.g., FIG. 4), the pulse-width controller may further comprise a fourth logic gate (e.g., G4 in FIG. 4). The fourth logic gate may comprise a seventh input terminal (e.g., i7), an eighth input terminal (e.g., i8) and a fourth output terminal (e.g., o4) respectively coupled to a first instruction signal (e.g., SCANEN), a second instruction signal (e.g., WEI) and the fourth node. In an embodiment (e.g., FIG. 4), each of the first logic gate, the second logic gate and the third logic gate may be a NOR gate.

In an embodiment (e.g., FIG. 4), the memory module may further comprise a finite state machine (FSM) circuit (e.g., 400 in FIG. 4) coupled between the pulse-width controller and the front node. When the pulse-width controller causes the voltage of the front node to change, the pulse-width controller may cause the FSM circuit to change the voltage of the front node.

In an embodiment (e.g., FIG. 4), the FSM circuit may comprise a fifth node (e.g., n5 in FIG. 4) and a sixth node (e.g., n6 in FIG. 4); the fifth node may be coupled to the first node, and the sixth node may be coupled to the front node.

In an embodiment (e.g., FIG. 4), the FSM circuit may further comprise a seventh node (e.g., n7) coupled to a clock (e.g., CLK). In an embodiment (e.g., FIG. 4), the memory module may further comprise a second inverter (e.g., iv2 in FIG. 4) coupled between the sixth node and the front node.

An object of the invention is providing a memory module (e.g., 100 in FIG. 1) with improved timing adaptivity of sensing amplification. The memory module may comprise at least one bit line (e.g., BL[q]), at least one word line (e.g., WL[p]), a tracking bit line (e.g., TBL) and a tracking word line (e.g., TWL), at least one memory cell (e.g., c[p,q]), at least one tracking cell (e.g., tc[p]), at least one sensing amplifier (e.g., SA[k]) and a first logic gate (e.g., G1 in FIG. 4). The tracking word line may extend from a front node (e.g., w1) to an end node (e.g., w3), and a length between the front node and the end node may be positively correlated to a length of each said word line. Each said memory cell may be coupled to one of the at least one bit line and one of the at least one word line. Each said tracking cell may be coupled to the tracking bit line. Each said sensing amplifier may be coupled to one of the at least one bit line, and may further be coupled to a third node (e.g., n3). Each said sensing amplifier may be disabled when a voltage of the third node is a first level (e.g., v1 in FIG. 5), and may be enabled when the voltage of the third node is a second level (e.g., v2 in FIG. 5). The first logic gate may comprise a first input terminal (e.g., i1 in FIG. 4), a second input terminal (e.g., i2 in FIG. 4) and a first output terminal (e.g., o1 in FIG. 4) respectively coupled to the tracking bit line, the end node and the front node. The voltage of the third node may be controlled by a voltage of the first output terminal when the memory module conducts data read.

In an embodiment (e.g., FIG. 4), the memory module may further comprise a third logic gate (e.g., G3 in FIG. 4) and a delay circuit (e.g., 500 in FIG. 4). The third logic gate may comprise a fifth input terminal (e.g., i5), a sixth input terminal (e.g., i6) and a third output terminal (e.g., o3); the fifth input terminal may be coupled to a second node (e.g., n2), the delay circuit may be coupled between the second node and the sixth input terminal, the third output terminal may be coupled to the third node, and the second node may be coupled to the first output terminal. In an embodiment (e.g., FIG. 6), the first logic gate and the delay circuit may be respectively supplied by two different supply voltages (e.g., Vdd1 and Vdd2 in FIG. 6).

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
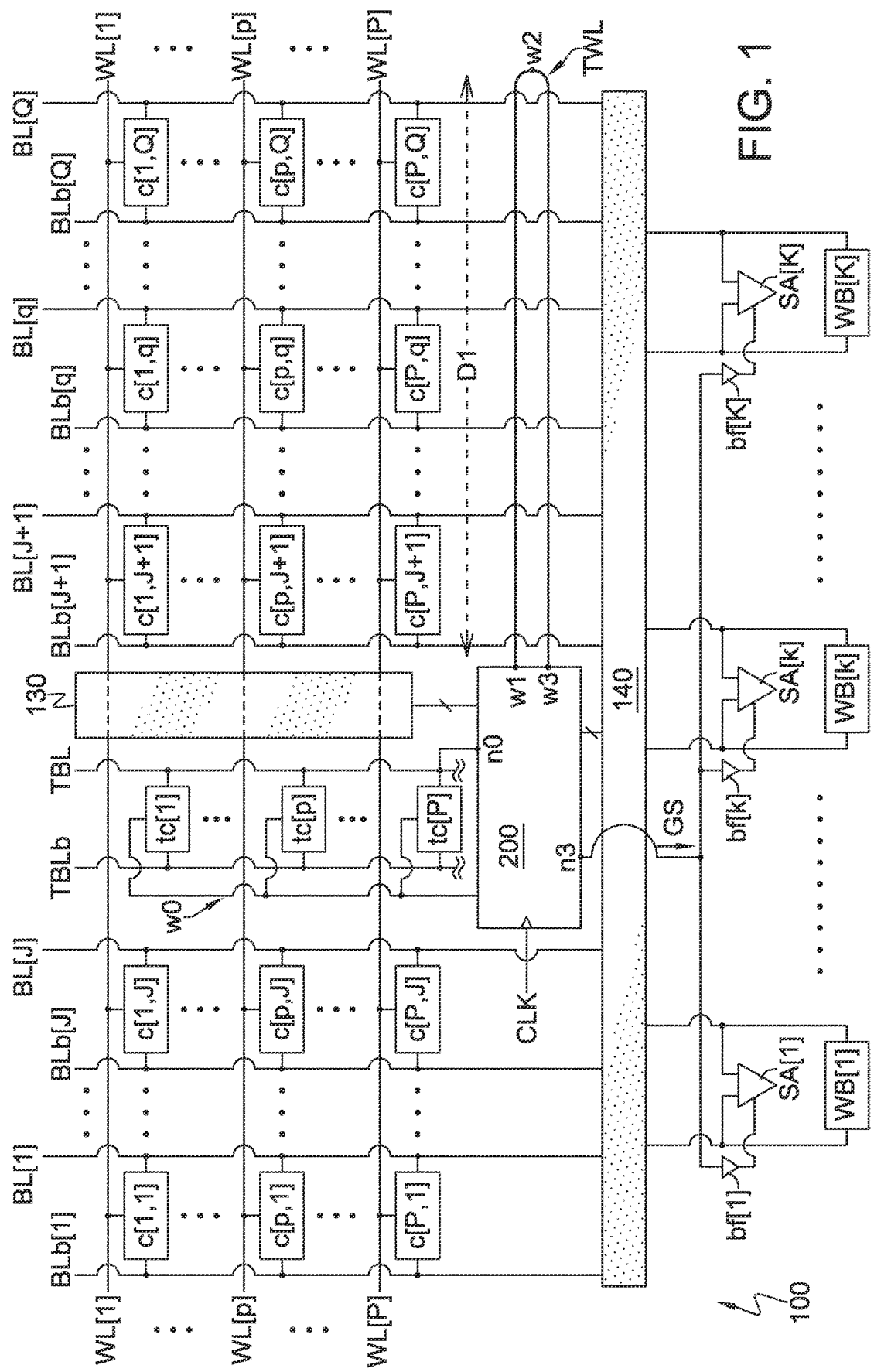
FIG. 1 depicts a memory module according to an embodiment of the invention, and the memory module may comprise a plurality memory cells and a control circuit.

FIG. 1 depicts a memory module 100 according to an embodiment of the invention; the memory module 100 may include a number P*Q of memory cells c[1,1] to c[P,Q], a number P of word lines WL[1] to WL[P], a number Q of sets of bit lines BL[1], BLb[1] to BL[Q], BLb[Q], number P of tracking cells tc[1] to tc[P], an auxiliary word line w0, a set of tracking bit lines TBL and TBLb, a tracking word line TWL, a number K of buffers bf[1] to bf[K], number K of sensing amplifiers SA[1] to SA[K], number K of write circuits WB[1] to WB[K], two peripheral circuits 130 and 140, and a control circuit 200. The numbers P, Q, K may be predetermined integers. The number Q may be an integer multiple of the number K; for example, the number Q may be one, two or four times of the number K. The number K (quantity of the sensing amplifiers or the write circuits) may represent an IO (input/output) count of the memory module 100.

Figure 2:
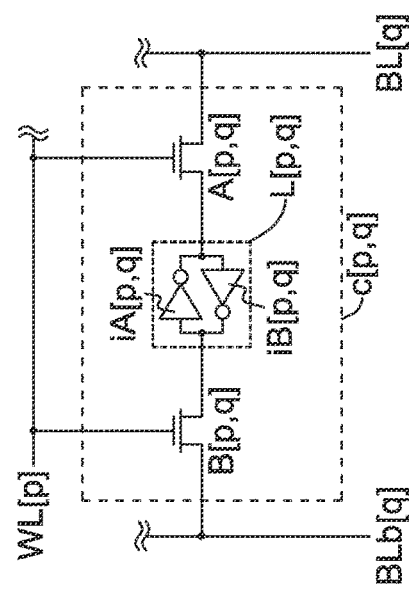
FIG. 2 depicts an embodiment of the memory cell shown in FIG. 1.

In the memory module 100, each memory cell c[p,q] (for p=1 to P, q=1 to Q) may be coupled to an associated world line WL[p] and an associated set of bit lines BL[q] and BLb[q], and may store data of one bit. Along with FIG. 1, FIG. 2 depicts an embodiment of each memory cell c[p,q]; the memory cell c[p,q] may comprise a set of inverters iA[p,q] and iB[p,q], and a set of pass gate transistors A[p,q] and B[p,q] (e.g., n-channel metal-oxide-semiconductor transistors). The inverters iA[p,q] and iB[p,q] may form a latch L[p,q]. The transistor A[p,q] may comprise a controlled terminal (e.g., a gate terminal) and two channel terminals (e.g., a drain terminal and a source terminal) respectively coupled to the word line WL[p], the bit line BL[q] and a terminal of the latch L[p,q]. The transistor B[p,q] may comprise a controlled terminal and two channel terminals respectively coupled to the word line WL[p], the bit line BLb[q] and another terminal of the latch L[p,q].

Back to FIG. 1, in the memory module 100, each tracking cell tc[p] may be coupled to the auxiliary word line w0 and the tracking bit lines TBL and TBLb. Circuitry of each tracking cell tc[p] and circuitry of each memory cell c[p,q] may be the same, so each tracking cell tc[p] may reflect (track) properties (e.g., response time, etc.) of each memory cell c[p,q].

As shown in FIG. 1, in the memory module 100, the tracking word line TWL may extend from a node w1 to another node w2, and may further extend from the node w2 to still another node w3. A length of the tracking word line TWL, from the node w1 (via the node w2) to the node w3, may be positively correlated to a length of each word line WL[p]. In an embodiment, a line structure (e.g., line length and width) of the tracking word line TWL may be similar to, or be substantially the same as, a line structure of each word line WL[p], so as to reflect (track) properties of each word line WL[p], such as equivalent resistance, equivalent load and response, etc. As shown in FIG. 1, the tracking word line TWL may horizontally extend from the nodes w1 to w2 by a distance D1, and extend from the nodes w2 to w3 backward by the same distance D1 (or an approximate distance). In other words, the length of the tracking word line TWL between the nodes w1 and w3 may be twice of the distance D1. As shown in FIG. 1, the distance D1 may horizontally cross a space from the bit lines BL[J+1], BLb[J+1] to BL[Q], BLb[Q], wherein the number J may be a predetermined integer; for example, the number Q may be an even number, and the number J may be a half of the number Q. Thus, twice of the distance D1 may substantially equal (or approximate) the length of each word line WL[p], since each word line WL[p] may horizontally cross the bit lines BL[1], BLb[1] to BL[J], BLb[J] and BL[J+1], BLb[J+1] to BL[Q], BLb[Q]. The tracking word line TWL may not be coupled to any memory cell c[p,q], i.e., the tracking word line TWL may be insulated from each of the memory cells c[1,1] to c[P,Q].

The peripheral circuit 130 may be coupled to the word lines WL[1] to WL[P], and may be controlled by the control circuit 200. The peripheral circuit 140 may be coupled to the sets of bit lines BL[1], BLb[1] to BL[Q], BLb[Q], the sensing amplifiers SA[1] to SA[K] and the write circuits WB[1] to WB[K], and may also be controlled by the control circuit 200.

The control circuit 200 may receive a clock CLK, and may accordingly control operations of the memory module 100; the control circuit 200 may be coupled to the peripheral circuits 130 and 140, as well as the nodes w1 and w3 of the tracking word line TWL; the control circuit 200 may also be coupled to the tracking bit line TBL at a node n0, and may further be coupled to the buffers bf[1] to bf[K] at another node n3.

The control circuit 200 may output a signal GS, which may be an enabling signal of the sensing amplifiers SA[1] to SA[K], via the node n3. Each sensing amplifiers SA[k] may be coupled to the peripheral circuit 104, and may further be coupled to the node n3 via the associated buffer bf[k] to receive the signal GS.

When writing data to the memory cell c[p,q] during a write cycle, the control circuit 200 may control the peripheral circuits 130 and 140, so the peripheral circuit 140 may electrically connect the associated bit lines BL[q] and BLb[q] to one write circuit WB[k] of the write circuits WB[1] to WB[K], and the peripheral circuit 130 may drive the associated word line WL[p] to cause the latch L[p,q] (FIG. 2) of the memory cell c[p,q] to be electrically connected to the bit lines BL[q] and BLb[q]. Hence, the write circuit WB[k] may write data to the memory cell c[p,q] via the bit lines BL[q] and BLb[q].

Figure 3:
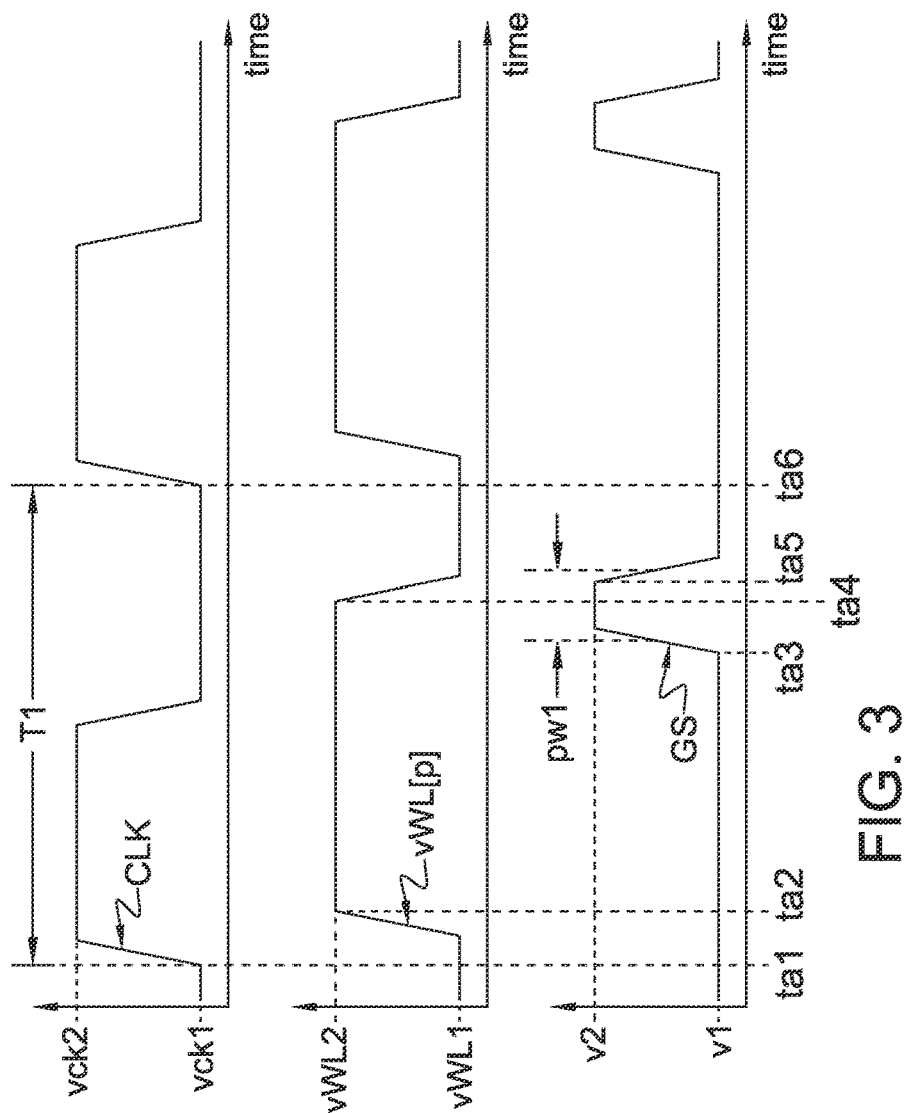
FIG. 3 depicts an embodiment of waveforms and timing when the memory module shown in FIG. 1 conducts data read.

Following FIG. 1 and FIG. 2, FIG. 3 depicts related waveforms and timing when the memory module 100 conducts data read. As shown in FIG. 3, during a period T1 of the clock CLK, a voltage of the clock CLK may alternate once between voltages vck1 and vck2. To read the memory cell c[p,q] (FIG. 1), the control circuit 200 may control the peripheral circuits 130 and 140 when the clock CLK starts to change from the voltages vck1 to vck2 at a time point ta1, so the peripheral circuit 140 may electrically connect the associated bit lines BL[q] and BLb[q] to one sensing amplifier SA[k] of the sensing amplifiers SA[1] to SA[K], and the peripheral circuit 130 may drive a voltage vWL[p] of the associated word line WL[p] from a voltage vWL1 (e.g., a voltage which does not turn on the pass gate transistors) to another voltage vWL2 (e.g., a voltage which turns on the pass gate transistors) at a later time point ta2 to cause the latch L[p,q] (FIG. 2) of the memory cell c[p,q] to be electrically connected to the bit lines BL[q] and BLb[q]. At another time point ta3, the control circuit 200 may start to activate the signal GS, i.e., may cause the signal GS to start changing from a level v1, which may represent deactivation, to a level v2 which may represent activation. The activated signal GS may enable the sensing amplifiers SA[1] to SA[K], and the enabled sensing amplifier SA[k] may sense a voltage difference between the bit lines BL[q] and BLb[q] to determine the data stored in the memory cell c[p,q]. At a later time point ta4, the control circuit 200 may control the peripheral circuit 130 (FIG. 1) to stop driving the word line WL[p], so the voltage vWL[p] may start to change back from the voltage vWL2 to the voltage vWL1. At a later time point ta5, the control circuit 200 may start to deactivate the signal GS, i.e., may cause the signal GS to start changing back from the level v2 to the level v1. As the signal GS is deactivated, the sensing amplifiers SA[1] to SA[K] may be disabled to stop operating. At a later time point ta6, the period T1 of the clock CLK may end. As shown in FIG. 3, a pulse-width pw1 during which the signal GS is kept at the level v2 may be a duration during which the sensing amplifiers SA[1] to SA[K] are controlled to stay enabled.

Figure 4:
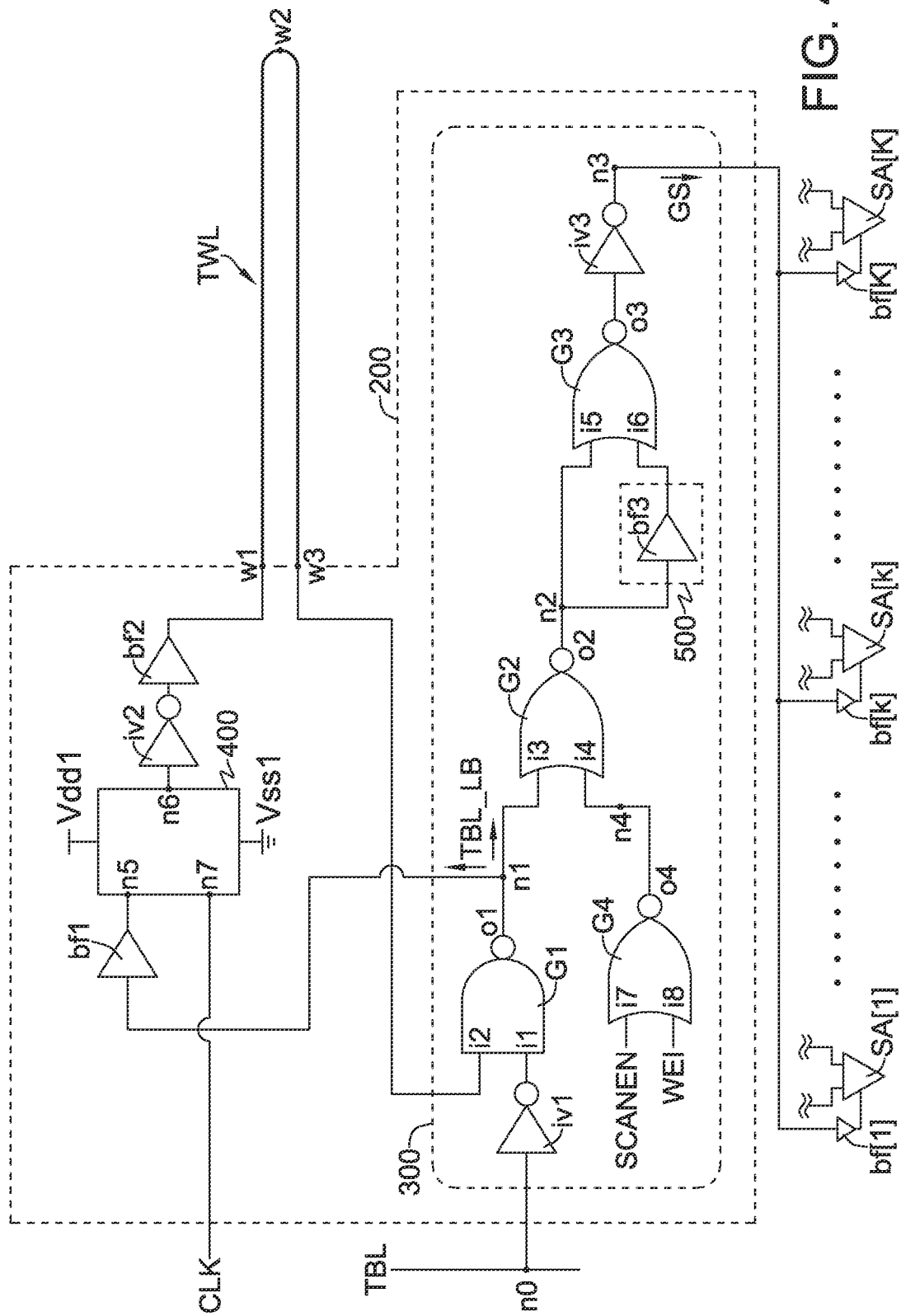
FIG. 4 depicts an embodiment of the control circuit shown in FIG. 1.

Following FIG. 1 to FIG. 3, FIG. 4 depicts an embodiment of the control circuit 200 according to the invention. As shown in FIG. 4, according to an embodiment of the invention, the control circuit 200 may comprise a pulse-width controller 300, a finite state machine (FSM) circuit 400, two buffers bf1 and bf2, and an inverter iv2. The pulse-width controller 300 may comprise four logic gates G1 to G4, inverters iv1 and iv3, and a delay circuit 500. The delay circuit 500 may comprise a buffer bf3. The FSM circuit 400 may be coupled between a supply voltage Vdd1 and a ground voltage Vss1, and may comprise nodes n5, n6 and n7; the clock CLK may be coupled to the node n7. The control circuit 200 may further comprise other circuit component(s), but the circuit component(s) is/are omitted, because such omission will not compromise technical disclosure of the invention.

As shown in FIG. 4, in the control circuit 200, the buffer bf1 may be coupled between a node n1 of the pulse-width controller 300 and the node n5 of the FSM circuit 400, and the inverter iv2 and the buffer bf2 may be serially coupled between the node n6 of the FSM circuit 400 and the node w1 of the tracking word line TWL. The FSM circuit 400 may control operation states of the memory module 100 under triggering of the clock CLK, and the pulse-width controller 300 may control timing of the signal GS, including its pulse-width pw1 (FIG. 3).

In the pulse-width controller 300, the logic gate G1 may be a NAND gate, and each of the gates G2 to G4 may be a NOR gate. The logic gate G1 may comprise two input terminals i1, i2 and an output terminal o1, the logic gate G2 may comprise two input terminals i3, i4 and an output terminal o2, the logic gate G3 may comprise two input terminals i5, i6 and an output terminal o3, and the logic gate G4 may comprise two input terminals i7, i8 and an output terminal o4. The inverter iv1 may be coupled between the node n0 and the input terminal i1, the delay circuit 500 may be coupled between a node n2 and the input terminal i6, the inverter iv3 may be coupled between the output terminal o3 and the node n3, and a voltage of the node n3 may form the signal GS.

As shown in FIG. 4, regarding the logic gate G1, the tracking bit line TBL may be coupled to the input terminal i1 via the node n0 and the inverter iv1, the node w3 of the tracking word line TWL may be coupled to the input terminal i2, the output terminal o1 may be coupled to the node n1, and a voltage of the node n1 may form a signal TBL_LB. As shown in FIG. 4, there may be two circuit paths branching from the node n1, one circuit path may cause the output terminal o1 of the logic gate G1 to be coupled to the node w1 of the tracking word line TWL via the buffer bf1, the nodes n5 and n6 of the FSM circuit 400, the inverter iv2 and the buffer bf2, while the other circuit path may cause the output terminal o1 of the logic gate G1 to be coupled to the node n3 (where the signal GS forms) via the logic gate G2, the node n2 and the delay circuit 500, the logic gate G3 and the inverter iv3.

In the pulse-width controller 300, the input terminal i3 and the output terminal o2 of the logic gate G2 may be coupled to the nodes n1 and n2 respectively, and the input terminal i4 may be coupled to another node n4. The input terminals i7, i8 and the output terminal o4 of the logic gate G4 may be coupled to an instruction signal SCANEN, an instruction signal WEI and the node n4, respectively. The signal SCANEN may reflect whether the memory module 100 conducts a scan operation. When the signal SCANEN is logic 1, the memory module 100 may conduct the scan operation; when the signal SCANEN is logic 0, the memory module 100 may not conduct the scan operation, and may therefore conduct data read or data write. The signal WEI may reflect whether the memory module 100 conducts data read. When the signal WEI is logic 0, the memory module 100 may conduct data write; when the signal WEI is logic 1, the memory module 100 may conduct data read.

Figures 7A, 7B:
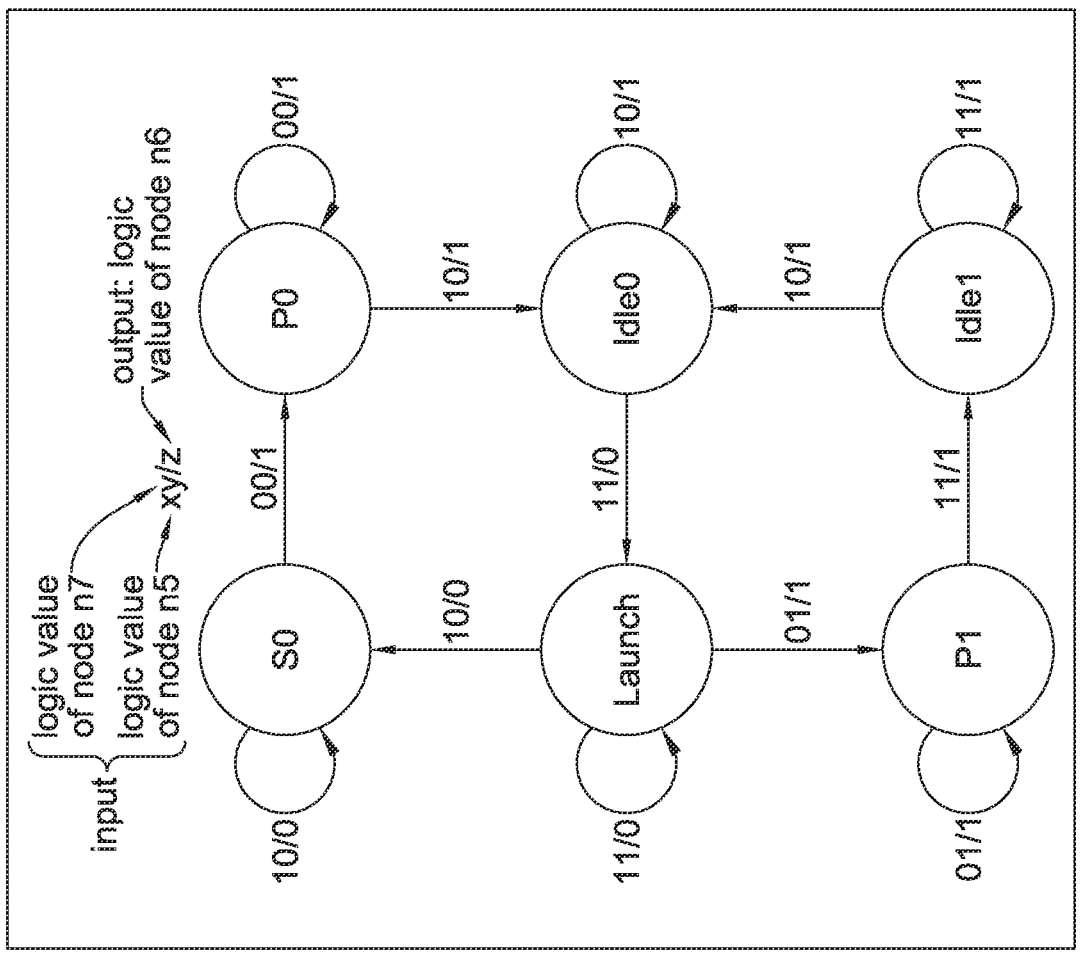
FIG. 7a and FIG. 7b respectively depict an embodiment of a state table and an embodiment of a state diagram of an FSM circuit shown in FIG. 4.

FIG. 7a and FIG. 7b respectively depict a state table and a state diagram of the FSM circuit 400 according to an embodiment of the invention. As shown in FIG. 7a and FIG. 7b, in an embodiment of the invention, the FSM circuit 400 may switch between states S0, P0, Launch, Idle0, Idle1 and P1; logic values of the nodes n5 and n7 (FIG. 4) may be considered as inputs of the FSM circuit 400, a logic value of the node n6 may be considered as an output of the FSM circuit 400, and the logic values of the nodes n5, n7 and n6 may be expressed in a form xy/z in FIG. 7a and FIG. 7b.

Following FIG. 1 to FIG. 4, FIG. 5 depicts timing and waveforms of related signals of the control circuit 200 (FIG. 4) when the memory module conducts data read, wherein voltages vw1, vw3, vTBL, vi5 and vi6 may be voltages of the nodes w1 and w3, the tracking bit line TBL (node n0) and the input terminals i5 and i6, respectively. At a time point t0, the clock CLK may start to change from the voltage vck1 (e.g., a voltage representing logic 0) to the voltage vck2 (e.g., a voltage representing logic 1). When the clock CLK changes from the voltages vck1 to vck2, the FSM circuit 400 (FIG. 4) may cause a voltage of the node n6 to change from the supply voltage Vdd1 (which may represent logic 1) to the ground voltage Vss1 (which may represent logic 0). As the voltage of the node n6 changes, operations of the inverter iv2 and the buffer bf2 may cause the voltage vw1 (FIG. 5) of the node w1 to start changing from a voltage v3 (e.g., a voltage representing logic 0) to a voltage v4 (e.g., a voltage representing logic 1) at a later time point t1. Due to the length of the tracking word line TWL, the voltage vw3 of the node w3 may change from the voltages v3 to v4 after a delay time d1.

As a voltage of the tracking word line TWL settles to the voltage v4, the voltage vTBL at the node n0 of the tracking bit line TBL may start to change (e.g., to fall) from an initial voltage vpr0 after a time point t2, and may change to a predetermined voltage vt0 at another time point t3. For example, the voltage vt0 may be a trip voltage of the inverter iv1; before the voltage of the node n0 reaches the voltage vt0 (i.e., before the time point t3), the inverter iv1 may determine that the voltage of the node n0 is logic 1; after the voltage of the node n0 reaches the voltage vt0 (i.e., after the time point t3), the inverter iv1 may turn to determine that the voltage of the node n0 is logic 0. Hence, the inverter iv1 may change an output to the input terminal i1 from logic 0 to logic 1 after the time point t3. In response to the logic value change received by the input terminal i1, the logic gate G1 may cause the signal TBL_LB to start changing from a voltage v6 (e.g., a voltage representing logic 1) to a voltage v5 (e.g., a voltage representing logic 0) at a later time point t4.

During data read, the signals SCANEN (FIG. 4) and WEI may cause the logic gate G4 to keep on outputting logic 0 from the output terminal o4 to the input terminal i4 of the logic gate G2. Therefore, as the signal TBL_LB starts to change from the voltages v6 to v5 after the time point t4, the logic gate G2 may cause the voltage vi5 (FIG. 5) of the input terminal i5 to start changing from a voltage v7 (e.g., a voltage representing logic 0) to a voltage v8 (e.g., a voltage representing logic 1) at a later time point t5. When the voltage vi5 (FIG. 5) of the input terminal i5 starts to change from the voltages v7 to v8 at the time point t5, the voltage vi6 of the input terminal i6 may remain to be the voltage v7 due to the delay circuit 500 between the node n2 and the input terminal i6. Hence, when the voltage vi5 starts to change from the voltages v7 to v8 at the time point t5, operation of the logic gate G3 and the inverter iv3 may cause the signal GS at the node n3 to start changing from the level v1 (e.g., a level representing logic 0) to the level v2 (e.g., a level representing logic 1) at a later time point t6, i.e., may start to activate the signal GS. In other words, as the voltage vTBL of the tracking bit line TBL changes to the predetermined voltage vt0 at the time point t3, the inverter iv1, the logic gates G1, G2 and G3, and the inverter iv3 may be triggered to serially operate, and may start to activate the signal GS at the time point t6.

When the signal TBL_LB at the mode n1 starts to change from the voltages v6 to v5 at the time point t4, the buffer bf1 may cause a voltage of the node n5 to change; in response to voltage change of the node n5, the FSM circuit 400 may cause the voltage of the node n6 to change to the supply voltage Vdd1; operations of the inverter iv2 and the buffer bf2 may cause the voltage vw1 of the node w1 to start changing back from the voltages v4 to v3 at a time point t7. In other words, as the voltage vTBL of the tracking bit line TBL changes to the predetermined voltage vt0 at the time point t3, the inverter iv1, the logic gate G1, the buffer bf1, the FSM circuit 400, the inverter iv2 and the buffer bf2 may be triggered to serially operate, and may cause the voltage vw1 of the node w1 to start change (from the voltages v4 back to v3) at the time point t7.

When the voltage vw1 of the node w1 starts to change at the time point t7, after the delay time d1, the tracking word line TWL may cause the voltage vw3 of the node w3 to start changing back from the voltages v4 to v3 at another time point t8 (=t7+d1). As the voltage of the tracking word line TWL settles back to the voltage v3, the voltage vTBL of the tracking bit line may be resumed to the voltage vpr0.

As the voltage vw3 starts to change back from the voltages v4 to v3 at the time point t8, the logic gate G1 may cause the signal TBL_LB to start changing back from the voltages v5 to v6 at a later time point t9. Consequently, the logic gate G2 may cause the voltage vi5 of the input terminal i5 to start changing back from the voltages v8 to v7 at a later time point t10; after a delay time d2, the delay circuit 500 may cause the voltage vi6 of the input terminal i6 to start changing back from the voltages v8 to v7 at another time point t11 (=t10+d2). As the voltages vi5 and vi6 of the input terminals i5 and i6 both change back to the voltage v7, operations of the logic gate G3 and the inverter iv3 may cause the signal GS to start changing back from the levels v2 to v1 at a time point t12, and may therefore start to deactivate the signal GS. In other words, as the voltage vw3 of the node w3 starts to change at the time point t8, the logic gates G1 and G2, the delay circuit 500, the logic gate G3 and the inverter iv3 may be triggered to serially operate, and may start to deactivate the signal GS at the time point t12.

From above description, pulse-width control of the signal GS according to the invention may be briefly reviewed as follows. When the voltage vTBL of the tracking bit line TBL changes to the predetermined voltage vt0 (at the time point t3), the pulse-width controller 300 may activate the enabling signal GS at the time point t6 (by operations of the inverter iv1, the logic gates G1, G2 and G3 and the inverter iv3 from the time points t3 to t6), and may cause the voltage vw1 of the node w1 to change at the time point t7 (by operations of the inverter iv1, the logic gate G1, the FSM circuit 400, the inverter iv2 and the buffer bf2 from the time points t3 to t7). When the voltage vw1 of the node w1 changes at the time point t7, the tracking word line TWL may cause the voltage vw3 of the node w3 to change at the time point t8 after the delay time d1. When the voltage vw3 of the node w3 changes at the time point t8, the pulse-width controller 300 may deactivate the enabling signal GS at the time point t12 after the delay time d2 (by operations of the logic gates G1 and G2, the delay circuit 500, the logic gate G3 and the inverter iv3 from the time points t8 to t12).

Figure 5:
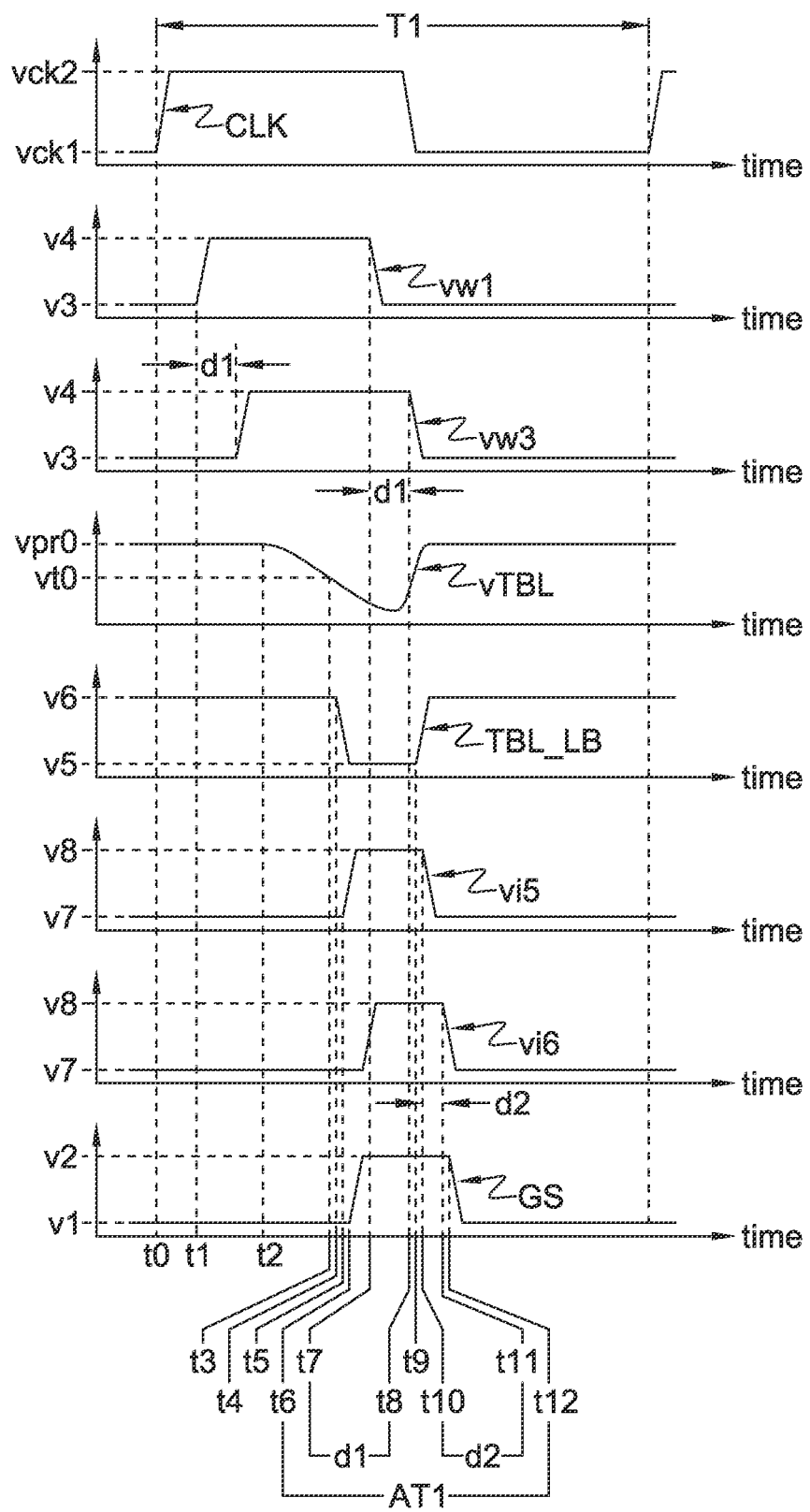
FIG. 5 depicts an embodiment of waveforms and timing related to the control circuit shown in FIG. 4.

As shown in FIG. 5, by operations of the pulse-width controller 300, a time interval (referred to as an activation interval AT1 hereinafter) from the time when the enabling signal GS starts to be activated (e.g., the time point t6) to the time when the enabling signal GS starts to be deactivated (e.g., the time point t12) may cover a sum of the delay times d1 and d2. Because the enabling signal GS may need a transient time (e.g., a rising time) to actually reach the activation level (e.g., a level representing logic 1) from the deactivation level (e.g., a level representing logic 0), the pulse-width during which the enabling signal GS really stays at the activation level may depend on a result subtracting the transient time from the activation interval AT1. Since the enabling signal GS needs to be sent to all the sensing amplifiers SA[1] to SA[K] (via the buffers bf[1] to bf[K]), as the IO count (the number K) of the memory module is larger, activating the enabling signal GS will face higher resistance, and the transient time will consequently be longer.

In prior art, the activation interval from the time when the enabling signal starts to be activated to the time when the enabling signal starts to be deactivated is fixed; accordingly, as the IO count of the conventional memory module is larger, the transient time will be longer, the pulse-width (a difference subtracting the longer transient time from the fixed activation interval) of the enabling signal will therefore be shorter, and will consequently be insufficient.

Comparing to the fixed activation interval of prior art, according to the invention, the activation interval AT1 from the time when the signal GS starts to be activated to the time when the signal GS starts to be deactivated will be self-adaptive. As the IO count (number) K is larger, the lengths of each word line WL[p] and the tracking word line TWL (FIG. 1) will be longer, the delay time d1 (FIG. 5) will therefore be longer, and the activation interval ATI which covers the delay time d1 will also be longer. Accordingly, even though the transient time is longer, the pulse-width (a difference subtracting the longer transient time from the longer activation time) of the signal GS will not be insufficient.

In the memory module 100, the tracking word line TWL may originally be utilized by the control circuit 200 to track properties and performances of each word line WL[p], so the control circuit 200 may dynamically adjust control on the memory module 100. The pulse-width controller 300 according to the invention may additionally expand usage of the tracking word line TWL by utilizing the existed tracking word line TWL to form feedback (from the output terminal o1 to the input terminal i2), so the activation interval AT1 may be positively correlated to the IO count (number) K to ensure that the signal GS has a sufficient pulse-width. Hence, the pulse-width controller 300 according to the invention may adapt various memory modules of different IO counts by one design. Furthermore, the delay circuit 500 in the pulse-width controller 300 may not need a large number of serially connected inverters to lengthen the activation interval AT1, and layout area of the pulse-width controller 300 may therefore be reduced. In an embodiment, the buffer bf3 in the delay circuit 500 may be formed by simply two serially connected inverters (not depicted).

Figure 6:
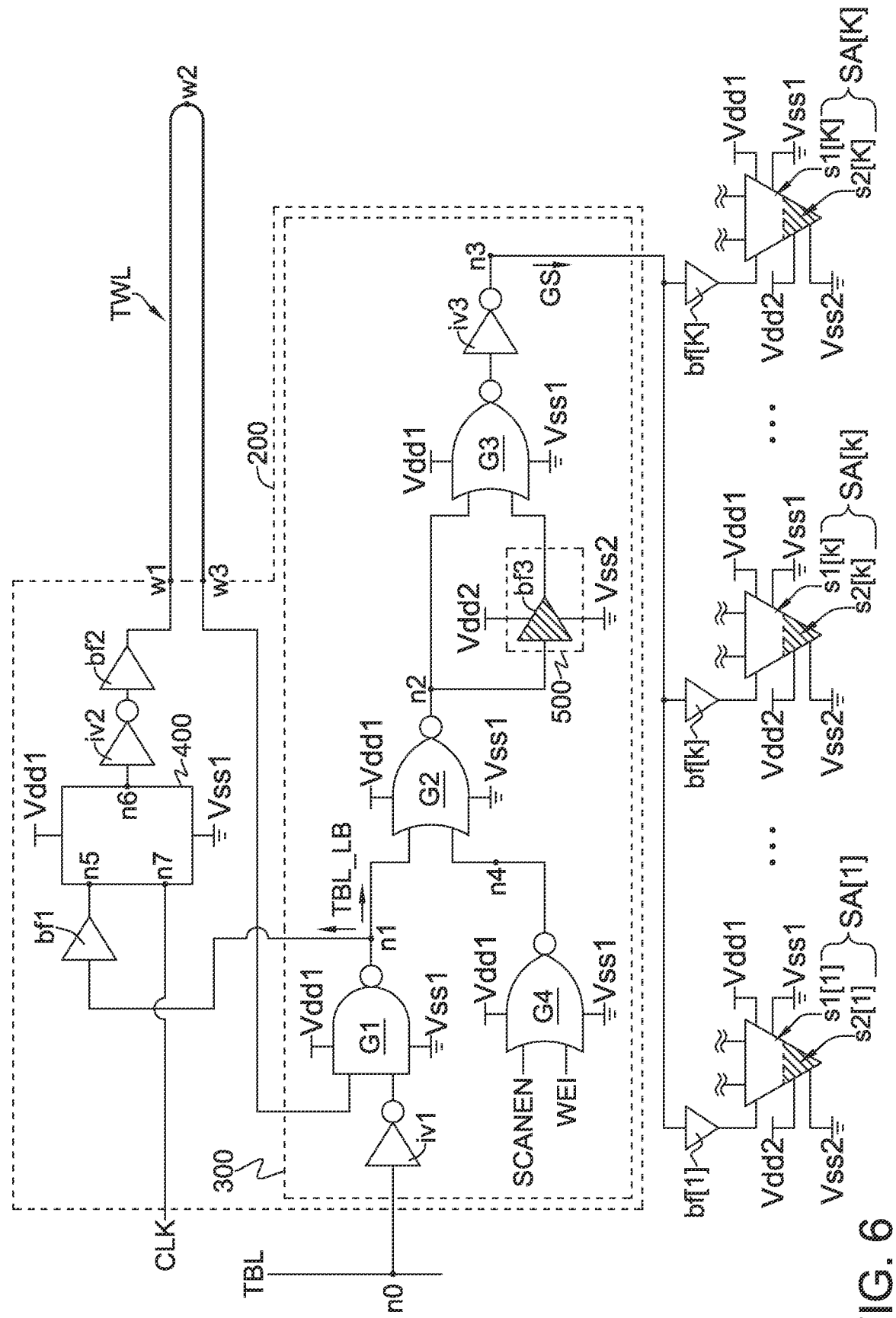
FIG. 6 depicts an embodiment of supply voltage configuration of the circuitry shown in FIG. 4.

Following FIG. 1 to FIG. 5, FIG. 6 depicts a supply voltage configuration according to an embodiment of the invention. For some special demands related to power consumption, efficiency and/or operations, some kinds of memory modules may be configured to cross different power domains, with different portions of a same memory module respectively supplied by different supply voltages. For example, as shown in FIG. 6, each sensing amplifier SA[k] (k=1 to K) may include two portions s1[k] and s2[k] which may belong to two power domains respectively; the portion s1 [k] may be biased between the supply voltage Vdd1 and the ground voltage Vss1, and therefore be supplied by the supply voltage Vdd1 (e.g., a memory supply voltage); the portion s2[k] may be biased between another supply voltage Vdd2 and another ground voltage Vss2, and may be supplied by the supply voltage Vdd2 (e.g., an interface supply voltage).

In an embodiment adopting a dual-rail sensing amplification, the supply voltages Vdd1 and Vdd2 may be different; the supply voltage Vdd1 may be higher or lower than the supply voltage Vdd2, and the ground voltages Vss1 and Vss2 may be coupled together. Because the portion s2[k] of each sensing amplifier SA[k] may be supplied by the supply voltage Vdd2, operation speed of each sensing amplifier SA[k] may relate to a value of the supply voltage Vdd2; consequently, pulse-width requirement of the enabling signal GS may relate to the value of the supply voltage Vdd2. If the supply voltage Vdd2 is lower, the operation speed of the sensing amplifier SA[k] may be slower, and the pulse-width of the signal GS may need to be longer, so the slower sensing amplifier SA[k] may have longer time to sense; on the other hand, if the supply voltage Vdd2 is higher, the operation speed of the sensing amplifier SA[k] may be faster, and the pulse-width of the signal GS may be set shorter.

To adapt the supply voltage Vdd2 of the sensing amplifier SA[k], the delay circuit 500 (the buffer bf3) in the pulse-width controller 300 may be biased between the supply voltage Vdd2 and the ground voltage Vss2 like the portion s2[k] of the sensing amplifier SA[k], and may therefore be supplied by the supply voltage Vdd2. On the other hand, the logic gates G1 to G4 and the inverters iv1 and iv3 in the pulse-width controller 300, as well as the FSM circuit 400, the inverter iv2 and the buffers bf1 and bf2 in the control circuit 200 may be biased between the supply voltage Vdd1 and the ground voltage Vss1 like the portion s1[k] of the sensing amplifier SA[k], and may be supplied by the supply voltage Vdd1. By such supply voltage configuration, the delay time d2 (FIG. 5) may be negatively correlated to the value of the supply voltage Vdd2; if the supply voltage Vdd2 is lower, operation speed of the delay circuit 500 may be slower, and the delay time d2 may therefore be longer; if the supply voltage Vdd2 is higher, the operation speed of the delay circuit 500 may be faster, and the delay time d2 may therefore be shorter. Because the activation interval AT1 (FIG. 5) of the signal GS may cover the delay time d2 of the delay circuit 500, a duration of the activation interval AT1 may also be negatively correlated to the value of the supply voltage Vdd2 like the delay time d2; if the supply voltage Vdd2 is set lower, the activation interval AT1 and the pulse-width of the signal GS may adaptively be longer; if the supply voltage Vdd2 is set higher, the activation interval AT1 and the pulse-width of the signal GS may adaptively be shorter.

In another embodiment adopting the dual-rail sensing amplification, the buffer(s) bf1 and/or bf2 may also be biased between the supply voltage Vdd2 and the ground voltage Vss2, and may, along with the delay circuit 500, jointly cause the activation interval AT1 (FIG. 5) to be negatively correlated to the supply voltage Vdd2. In still another embodiment, the buffer(s) bf1 and/or bf2 may be biased between the supply voltage Vdd2 and the ground voltage Vss2, the delay circuit 500 may be omitted, and the logic gate G3 may be an inverter coupled between the node n2 and the inverter iv3.

Comparing to the dual-rail sensing amplification, in another kind of embodiment adopting a single-rail sensing amplification, the supply voltage Vdd2 may equal the supply voltage Vdd1; i.e., the control circuit 200 and each sensing amplifier SA[k] may belong to a same power domain supplied by the same supply voltage Vdd1.

To sum up, in prior art, the enabling signal of sensing amplifiers suffers from a fixed activation interval, and thus fails to adapt different demands of various memory modules. In contrast, the invention may expand usage of the existed tracking word line; the pulse-width controller according to the invention may utilize the tracking word line to form feedback, so the activation interval may be positively correlated to the IO count, and may therefore adapt various memory modules of different IO counts. Moreover, for the dual-rail sensing amplification, the pulse-width controller according to the invention may have different portions respectively configured to different power domains, so the activation interval of the enabling signal may be negatively correlated to supply voltage of the sensing amplifiers, and may hence adapt various memory modules of different supply voltage configurations.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A memory module with improved timing adaptivity of sensing amplification, comprising:
at least one bit line, at least one word line, a tracking bit line and a tracking word line; the tracking word line comprising a front node and an end node, and a length between the front node and the end node being positively correlated to a length of each said word line;
at least one memory cell, each said memory cell coupled to one of the at least one bit line and one of the at least one word line;
at least one tracking cell coupled to the tracking bit line;
at least one sensing amplifier; each said sensing amplifier coupled to one of the at least one bit line, receiving an enabling signal, being enabled when the enabling signal is activated, and being disabled when the enabling signal is deactivated; and
a pulse-width controller coupled to the tracking bit line, the front node, and the end node, and providing the enabling signal; wherein:
when a voltage of the tracking bit line changes to a predetermined voltage, the pulse-width controller activates the enabling signal, and causes a voltage of the front node to change;
when the voltage of the front node changes, the tracking word line causes a voltage of the end node to change after a first delay time; and
when the voltage of the end node changes, the pulse-width controller deactivates the enabling signal after a second delay time.

2. The memory module of claim 1, wherein the pulse-width controller has a portion which is supplied by a first supply voltage, each said sensing amplifier at least has a portion which is supplied by a second supply voltage; the first supply voltage and the second supply voltage are different, and a duration of the second delay time is negatively correlated to a value of the second supply voltage.

3. The memory module of claim 1, wherein the pulse-width controller has two portions respectively supplied by two different supply voltages, and a duration of the second delay time is negatively correlated to one of the two different supply voltages.

4. The memory module of claim 1, wherein the pulse-width controller comprises a first logic gate, the first logic gate comprises a first input terminal, a second input terminal, and a first output terminal respectively coupled to the tracking bit line, the end node and a first node; the pulse-width controller forms the enabling signal at a third node, and a voltage of the third node is controlled by a voltage of the first node when the memory module conducts data read.

5. The memory module of claim 4, wherein the pulse-width controller further comprises a first inverter coupled between the tracking bit line and the first input terminal.

6. The memory module of claim 4, wherein the first logic gate is a NAND gate.

7. The memory module of claim 4, wherein the pulse-width controller further comprises a third logic gate and a delay circuit; the third logic gate comprises a fifth input terminal, a sixth input terminal and a third output terminal, the fifth input terminal is coupled to a second node, the delay circuit is coupled between the second node and the sixth input terminal, and the third output terminal is coupled to the third node; a voltage of the second node is controlled by the voltage of the first node when the memory module conducts data read.

8. The memory module of claim 7, wherein the pulse-width controller further comprises a third inverter coupled between the third output terminal and the third node.

9. The memory module of claim 7, wherein the first logic gate and the delay circuit are respectively supplied by a first supply voltage and a second supply voltage, and the first supply voltage is different from the second supply voltage.

10. The memory module of claim 9, wherein each said sensing amplifier at least has a portion supplied by the second supply voltage.

11. The memory module of claim 7, wherein the pulse-width controller further comprises a second logic gate; the second logic gate comprises a third input terminal, a fourth input terminal and a second output terminal respectively coupled to the first node, a fourth node and the second node.

12. The memory module of claim 11, wherein the pulse-width controller further comprises a fourth logic gate; the fourth logic gate comprises a seventh input terminal, an eighth input terminal and a fourth output terminal respectively coupled to a first instruction signal, a second instruction signal and the fourth node.

13. The memory module of claim 12, wherein each of the first logic gate, the second logic gate and the third logic gate is a NOR gate.

14. The memory module of claim 1 further comprising a finite state machine (FSM) circuit coupled between the pulse-width controller and the front node; wherein when the pulse-width controller causes the voltage of the front node to change, the pulse-width controller causes the FSM circuit to change the voltage of the front node.

15. The memory module of claim 14, wherein the FSM circuit comprises a fifth node and a sixth node, the pulse-width controller comprises a first node; the fifth node is coupled to the first node, and the sixth node is coupled to the front node.

16. The memory module of claim 15, wherein the FSM circuit further comprises a seventh node coupled to a clock.

17. The memory module of claim 15 further comprising a second inverter coupled between the sixth node and the front node.

18. A memory module with improved timing adaptivity of sensing amplification, comprising:
   at least a bit line, at least a word line, a tracking bit line and a tracking word line; the tracking word line extending from a front node to an end node, and a length between the front node and the end node being positively correlated to a length of each said word line;
   at least one memory cell, each said memory cell coupled to one of the at least one bit line and one of the at least one word line;
   at least one tracking cell coupled to the tracking bit line;
   at least one sensing amplifier; each said sensing amplifier coupled to a third node and one of the at least one bit line, being disabled when a voltage of the third node is a first level, and being enabled when the voltage of the third node is a second level; and
   a first logic gate comprising a first input terminal, a second input terminal and a first output terminal respectively coupled to the tracking bit line, the end node and the front node; wherein:
   the voltage of the third node is controlled by a voltage of the first output terminal when the memory module conducts data read.

19. The memory module of claim 18 further comprising a third logic gate and a delay circuit, wherein the third logic gate comprises a fifth input terminal, a sixth input terminal and a third output terminal; the fifth input terminal is coupled to a second node, the delay circuit is coupled between the second node and the sixth input terminal, the third output terminal is coupled to the third node, and the second node is coupled to the first output terminal.

20. The memory module of claim 19, wherein the first logic gate and the delay circuit are respectively supplied by two different supply voltages.

* * * * *